US009893145B1

(12) United States Patent
Cheng et al.

(10) Patent No.: US 9,893,145 B1
(45) Date of Patent: Feb. 13, 2018

(54) ON CHIP MIM CAPACITOR

(71) Applicant: International Business Machines Corporation, Armonk, NY (US)

(72) Inventors: Kangguo Cheng, Schenectady, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/232,001

(22) Filed: Aug. 9, 2016

(51) Int. Cl.
*H01L 21/20* (2006.01)
*H01L 49/02* (2006.01)
*H01L 27/06* (2006.01)
*H01L 29/06* (2006.01)
*H01L 29/66* (2006.01)

(52) U.S. Cl.
CPC .......... *H01L 28/60* (2013.01); *H01L 27/0629* (2013.01); *H01L 29/0653* (2013.01); *H01L 29/66545* (2013.01)

(58) Field of Classification Search
CPC .......... H01L 29/92; H01L 27/06; H01L 21/02; H01L 21/8234; H01L 29/00; H01G 2/00
See application file for complete search history.

(56) References Cited

U.S. PATENT DOCUMENTS

| 6,787,836 | B2 | 9/2004 | Clevenger et al. |
| 7,163,853 | B2 | 1/2007 | Tu |
| 7,750,388 | B2 | 7/2010 | Ho et al. |
| 7,859,081 | B2 | 12/2010 | Doyle et al. |
| 7,884,408 | B2 | 2/2011 | Tu et al. |
| 8,017,997 | B2 | 9/2011 | Divakaruni et al. |
| 8,860,107 | B2 | 10/2014 | Haensch et al. |
| 2007/0057343 | A1 | 3/2007 | Chinthakindi et al. |
| 2008/0173978 | A1 | 7/2008 | Tu |
| 2009/0095995 | A1* | 4/2009 | Kawashima ........ H01L 27/0629 257/296 |
| 2010/0013047 | A1 | 1/2010 | Theis et al. |
| 2011/0031585 | A1* | 2/2011 | Xia ...................... H01L 27/0629 257/532 |

(Continued)

OTHER PUBLICATIONS

Anonymous, "Method and structure for forming FEOL on-chip MIM capacitor", IP.com No. IPCOM000245179D, Feb. 17, 2016 (6 pages).

*Primary Examiner* — Charles Garber
*Assistant Examiner* — Abdulfattah Mustapha
(74) *Attorney, Agent, or Firm* — Vazken Alexanian; Michael J.Chang, LLC

(57) ABSTRACT

On-chip, three-dimensional MIM capacitors are provided. In one aspect, a method for forming a device includes: forming at least one MOSFET structure and at least one MIM capacitor structure on a substrate each structure including: a metal gate, and source and drain regions on opposite sides of the metal gate, and wherein the structures are buried in a dielectric; forming metal contacts in the dielectric down to the source and drain regions; forming a mask that selectively covers the MOSFET structure; removing the dielectric from uncovered portions of the MIM capacitor structure forming gaps between the metal contacts and the metal gate in the MIM capacitor structure; depositing a capacitor dielectric in the gaps; and depositing a fill metal onto the capacitor dielectric filling the gaps. A MIM capacitor and a device including an MIM capacitor are also provided.

21 Claims, 7 Drawing Sheets

(56) References Cited

U.S. PATENT DOCUMENTS

| | | |
|---|---|---|
| 2011/0210384 A1 | 9/2011 | Xia et al. |
| 2013/0146959 A1 | 6/2013 | Cheng et al. |
| 2015/0108557 A1 | 4/2015 | Ponoth et al. |
| 2015/0221638 A1* | 8/2015 | Chidambaram .... H01L 23/5228 257/296 |

* cited by examiner

ON CHIP MIM CAPACITOR

FIELD OF THE INVENTION

The present invention relates to metal-insulator-metal (MIM) capacitors, and more particularly, to on-chip, three-dimensional MIM capacitors and techniques for fabrication thereof.

BACKGROUND OF THE INVENTION

MIM capacitors include an insulator sandwiched between two metal layers, hence metal-insulator-metal or MIM. On-chip MIM capacitors are needed for a variety of applications, such as decoupling capacitors. Conventional planar MIM capacitor designs, however, consume a large chip area.

Therefore, there is a need for an MIM capacitor with increased capacitance for a given chip area.

SUMMARY OF THE INVENTION

The present invention provides on-chip, three-dimensional metal-insulator-metal (MIM) capacitors and techniques for fabrication thereof. In one aspect of the invention, a method for forming a device is provided. The method includes: forming at least one metal-oxide-semiconductor field effect transistor (MOSFET) structure on a first active area of a substrate and at least one MIM capacitor structure on a second active area of the substrate, wherein the MOSFET and MIM structures each includes: a metal gate, and source and drain regions on opposite sides of the metal gate, and wherein the MOSFET and MIM structures are buried in a dielectric; forming metal contacts in the dielectric over, and extending down to, the source and drain regions; forming a mask that selectively covers the MOSFET structure leaving at least a portion of the MIM capacitor structure uncovered; removing the dielectric from the uncovered portion of the MIM capacitor structure forming gaps between the metal contacts and the metal gate in the MIM capacitor structure; depositing a capacitor dielectric in the gaps over the metal contacts and the metal gate in the MIM capacitor structure; and depositing a fill metal onto the capacitor dielectric filling the gaps, wherein the metal contacts and the metal gate in the MIM capacitor structure are a first electrode, and the fill metal is a second electrode of the MIM capacitor structure, and wherein the capacitor dielectric separates the first electrode from the second electrode.

In another aspect of the invention, a MIM capacitor is provided. The MIM capacitor includes: a metal gate; source and drain regions on opposite sides of the metal gate; metal contacts on the source and drain regions; a capacitor dielectric over the metal contacts and the metal gate; and a fill metal on the capacitor dielectric filling gaps between the metal gate and the metal contacts, wherein the metal contacts and the metal gate comprise a first electrode, and the fill metal comprises a second electrode of the MIM capacitor, and wherein the capacitor dielectric separates the first electrode from the second electrode.

In yet another aspect of the invention, a device is provided. The device includes: a MOSFET on a first active area of a substrate, the MOSFET having: a first metal gate, and first source and drain regions on opposite sides of the first metal gate; and a MIM capacitor on a second active area of the substrate, the MIM capacitor having: a second metal gate, second source and drain regions on opposite sides of the second metal gate, metal contacts on the second source and drain regions; a capacitor dielectric over the metal contacts and the second metal gate, and a fill metal on the capacitor dielectric filling gaps between the second metal gate and the metal contacts, wherein the metal contacts and the second metal gate are a first electrode, and the fill metal is a second electrode of the MIM capacitor, and wherein the capacitor dielectric separates the first electrode from the second electrode.

A more complete understanding of the present invention, as well as further features and advantages of the present invention, will be obtained by reference to the following detailed description and drawings.

DETAILED DESCRIPTION OF PREFERRED EMBODIMENTS

Provided herein are three-dimensional (3D) metal-insulator-metal (MIM) capacitors and techniques for formation thereof which provide a greater capacitance for a given chip area as compared to conventional planar capacitor designs. Thus, the present MIM capacitors are ideal for use in on-chip applications where space is at a premium.

A MIM capacitor includes two metal electrodes separated by an insulator. In general, the metal electrodes in an MIM capacitor can be a metal (such as tungsten, copper, cobalt, titanium, aluminum, tantalum, etc.) or a conducting metallic compound (such as titanium nitride, tantalum nitride, tantalum carbide, etc.). According to the present techniques, a 3D MIM capacitor design is presented where one of the two electrodes (also referred to herein as the first electrode) is formed by a metal gate and trench metal contacts. The other electrode (also referred to herein as the second electrode) is formed by a metal fill between the gate and trench contacts. The insulator is a capacitor dielectric (such as a high-κ dielectric) between the first and second electrodes. The term "high-κ" as used herein refers to a material having a relative dielectric constant κ which is much higher than that of silicon dioxide (e.g., a dielectric constant κ=25 for $HfO_2$ rather than 4 for silicon dioxide). By way of example only, suitable high-κ materials include, but are not limited to, hafnium oxide ($HfO_2$), zirconium oxide ($ZrO_2$), and/or lanthanum oxide ($La_2O_3$).

Figure 1:
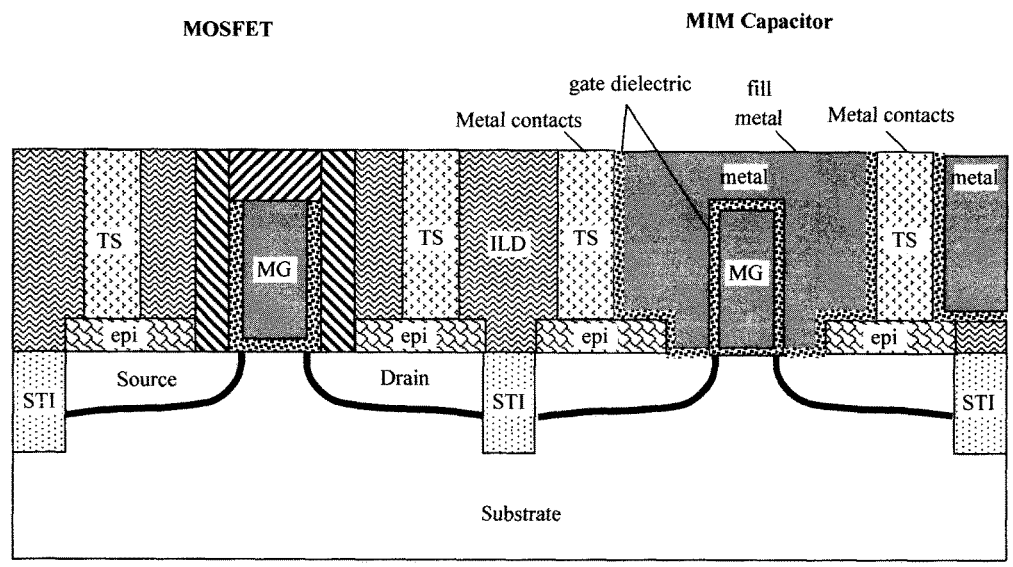
FIG. 1 is a cross-sectional diagram illustrating the present metal-insulator-metal (MIM) capacitor alongside a metal-oxide-semiconductor field effect transistor (MOSFET) on the same chip according to an embodiment of the present invention.

Advantageously, the present MIM capacitors can be fabricated alongside regular transistors on the same chip. See, for example, FIG. 1. FIG. 1 depicts the present MIM capacitor alongside a metal-oxide-semiconductor field effect transistor (MOSFET) on the same chip. Of course, the illustration of a single MOSFET and a single MIM capacitor is merely an example, and the present techniques may be implemented in the same manner described to produce more than one MOSFET and/or more than one MIM capacitor, and/or the MIM capacitor(s) themselves with or without MOSFET devices.

As shown in FIG. 1, the MIM capacitor includes a metal gate (labeled "MG") and metal contacts which make up the first electrode of the MIM capacitor. According to an exemplary embodiment, the metal contacts are formed from a trench silicide (labeled "TS") or any other suitable conducting material(s). A capacitor dielectric (the insulator) separates the metal gate and the metal contacts from a fill metal which makes up the second electrode. According to an exemplary embodiment, the capacitor dielectric is a high-κ gate dielectric, such as $HfO_2$, $ZrO_2$ and/or $La_2O_3$.

Thus, the metal/insulator/metal in this example includes the metal gate and metal contacts/capacitor dielectric/fill metal. Also, by employing a three dimensional MIM capacitor design, the capacitance is increased for a given chip area.

An exemplary methodology for forming the present MIM capacitor is now described by way of reference to FIGS. 2-13. In the following description, the MIM capacitor will be formed alongside a MOSFET. This is done to illustrate the compatibility of the present techniques with standard complementary metal oxide semiconductor (CMOS) processing.

Figure 2:
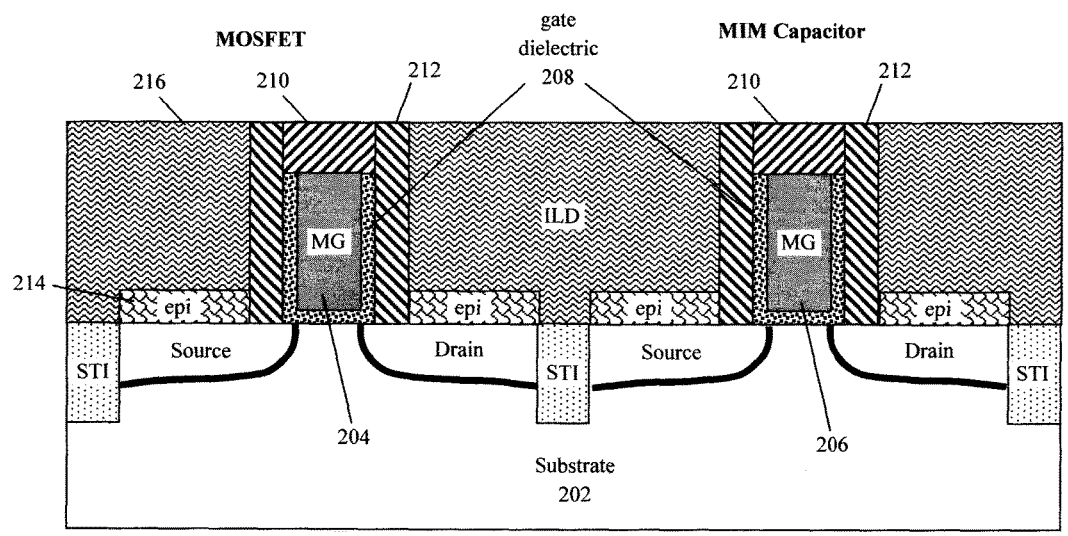
FIG. 2 is a cross-sectional diagram illustrating a starting structure for fabricating a device having a MIM capacitor and MOSFET on the same chip including a substrate, first metal gate(s) and second metal gate(s) on the substrate, spacers, source and drain regions (with epitaxy) on opposite sides of the metal gates offset by the spacers, and an inter-layer dielectric surrounding the metal gates according to an embodiment of the present invention.
Figure 3:
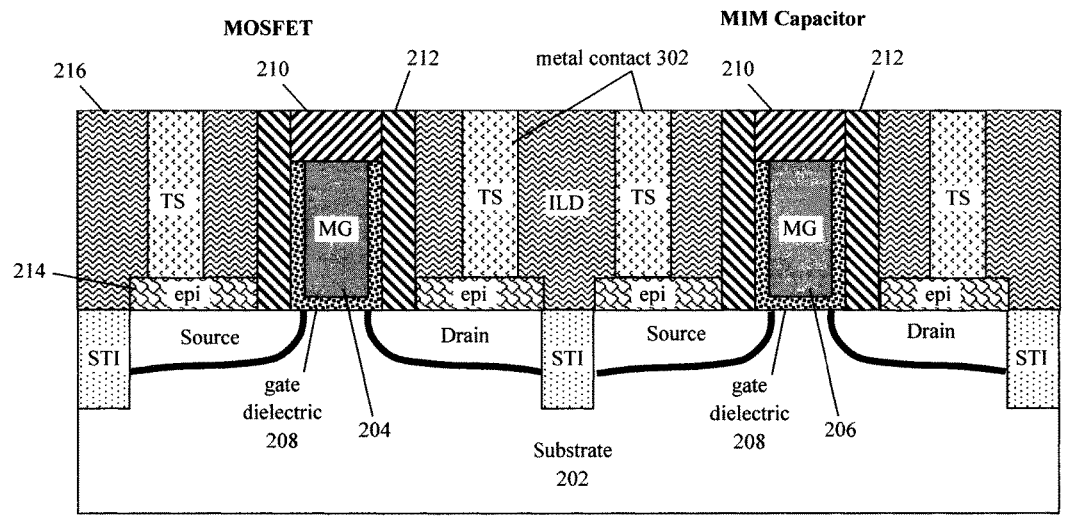
FIG. 3 is a cross-sectional diagram illustrating metal contacts having been formed in the interlayer dielectric extending down to the source and drain epitaxy according to an embodiment of the present invention.

As shown in FIG. 2, the process begins with a substrate 202 in which one or more active areas are defined. Suitable substrates include, but are not limited to, bulk semiconductor (e.g., bulk silicon (Si), germanium (Ge), silicon germanium (SiGe), etc. substrates) and silicon-on-insulator (SOI) substrates. SOI substrates generally include a SOI layer separated from an underlying substrate by a buried insulator. When the buried insulator is an oxide, it is also referred to as a buried oxide or BOX. These different possible substrate configurations are represented generically in the figures by substrate 202.

The active region isolation is achieved in the instant example through the use of shallow trench isolation or STI. In general, STI involves patterning trenches in a substrate, and then filling the trenches with one insulator (e.g., an STI oxide) or multiple insulator(s), such as silicon dioxide ($SiO_2$), silicon nitride, silicon oxynitride, or any suitable combination of those materials.

In the instant example at least one first metal gate 204 (corresponding to at least one MOSFET) and at least one second metal gate 206 (corresponding to at least one MIM capacitor) are formed on the substrate 202 in a first one or more of the active regions (labeled "MOSFET") and in a second one or more of the active regions (labeled "MIM Capacitor"), respectively. The metal gates 204 and 206 are separated from the substrate 202 by a gate dielectric 208, which is preferably a high-κ gate dielectric such as $HfO_2$, $ZrO_2$ and/or $La_2O_3$. An insulator cap 210 is formed on each of the metal gates 204 and 206, and spacers 212 are formed on opposite sides of the metal gates 204 and 206. Source and drain regions with epitaxy 214 (i.e., source and drains) are also formed on opposite sides of the metal gates 204 and 206, offset by the spacers 212. The metal gates 204 and 206 are surrounded by an inter-layer dielectric (ILD) 216. It is notable that, at this stage in the process, the MOSFET and the MIM capacitor can have the same structure, and thus can be co-fabricated.

A number of different approaches can be used to fabricate the MOSFET and MIM capacitor structures shown in FIG. 2. For instance, either a gate-first or a gate-last process may be employed. With a gate first process, the metal gates are placed early in the process, followed by the spacers, source drain implants, etc. A drawback, however, to the gate-first approach is that the gate materials are exposed throughout the process to potentially damaging conditions such as elevated temperatures. Advantageously, with a gate-last approach the gate materials are not placed until the end of the process thus minimizing their exposure to harmful conditions. Specifically, with a gate-last approach sacrificial or dummy gates are placed early in the process. These dummy gates serve as a placeholder for what will be the final gates of the device, in this case metal gates that are used to replace the dummy gates. Thus, this gate-last process is also referred to herein as a replacement metal gate or RMG process. The dummy gates permit placement of the spacers, source and drain regions, etc., after which, a dielectric (e.g., inter-layer dielectric 216) is deposited around the dummy gates. The dummy gates are then removed, forming trenches in the dielectric, and the replacement metal gates are formed in the trenches. An exemplary methodology for using a replacement metal gate process to fabricate the structure shown in FIG. 1 is described in conjunction with the description of FIG. 13, below.

Next, metal contacts 302 are formed in the ILD 216 over, and extending down to, the source and drain regions. See FIG. 3. According to an exemplary embodiment, the metal contacts 302 are formed using a trench silicide (TS) process. For instance, standard lithography and etching processes are used to pattern contact trenches in the ILD 216 over each of the source and drain regions. One contact trench is patterned for each of the metal contacts 302 being formed. A liner is first deposited into the contact trenches followed by a conducting metal to fill the trenches. Suitable liner materials include, but are not limited to, titanium (Ti) and/or nickel-platinum (NiPt). Suitable conducting metals include, but are not limited to, tungsten (W). The liner contacts and reacts (via an anneal) with the semiconductor source/drain to form a silicide interface between the conducting metal (e.g., the W) and semiconductor source/drain. According to an exemplary embodiment, the anneal is performed at a temperature of greater than about 400° C., e.g., from about 500° C. to about 1,000° C., and ranges therebetween. Alternatively, the metal contacts 302 can be formed by filling the contact trench with any suitable conductor(s).

Up to now, the MOSFET and MIM capacitor regions have been processed together in the same manner (e.g., the MOSFET and MIM capacitor devices up to this point have the same structure). However, at this point in the process, the structures will diverge as the MIM capacitors will be selectively processed, while the MOSFETs are masked.

Figure 4:
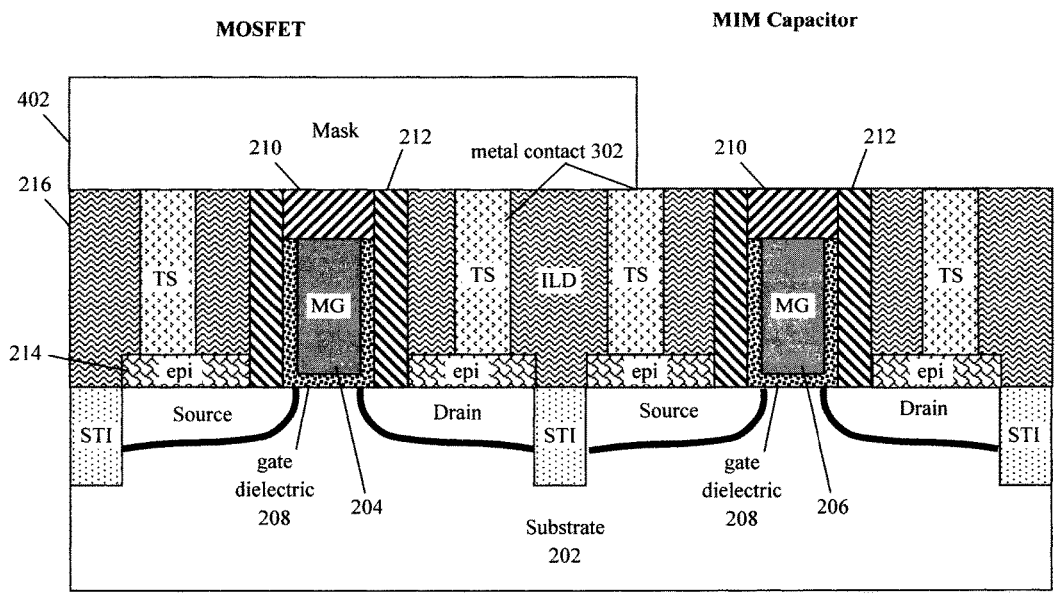
FIG. 4 is a cross-sectional diagram illustrating a mask having been applied to cover the MOSFET region(s) and to expose the MIM capacitor region(s) according to an embodiment of the present invention.

Namely, as shown in FIG. 4, a patterned mask 402 has been formed over/covering the MOSFET device(s), leaving the MIM capacitor device(s) uncovered (exposed). According to an exemplary embodiment, mask 402 is formed from a suitable hardmask material, such as a nitride hardmask material, which is patterned using standard lithography and etching techniques. More specifically, the mask 402 will entirely cover the MOSFET device(s) but will actually leave only a portion of the MIM capacitor device(s) uncovered and exposed. To look at it another way, the mask 402 will also partially cover and block the MIM capacitor devices. This is done so that (later in the process) contacts can be formed to the metal gate in the MIM capacitor region(s).

Figure 5:
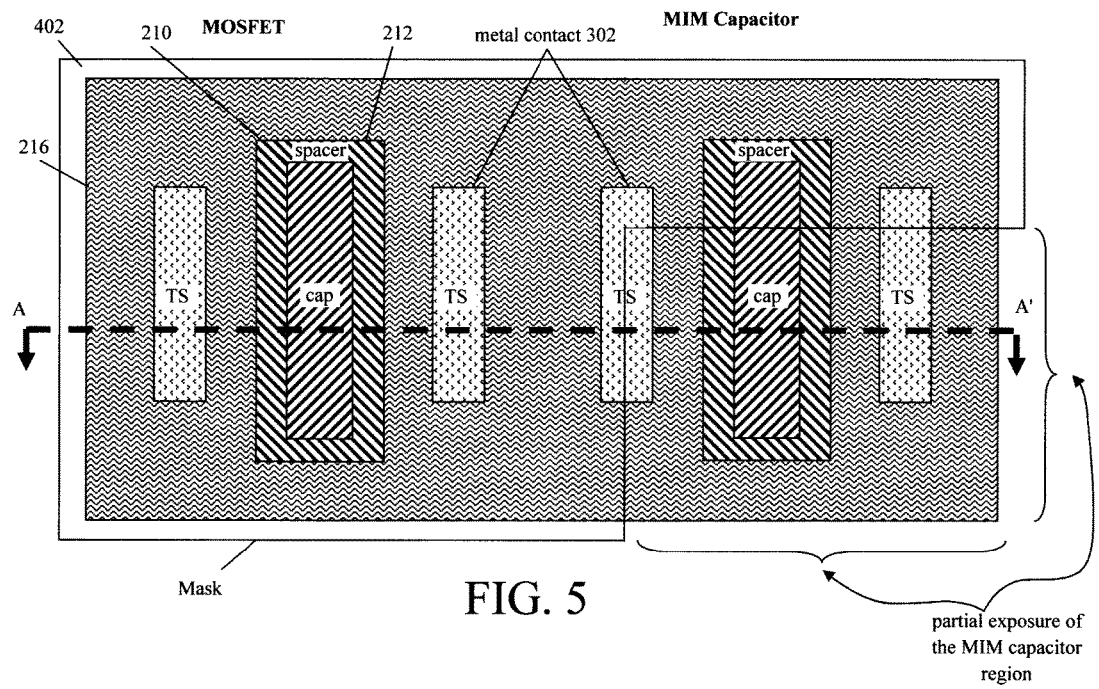
FIG. 5 is a top-down diagram illustrating how the mask fully covers the MOSFET region(s) and partially covers the MIM capacitor region(s) according to an embodiment of the present invention.

Namely, the part of each MIM capacitor device that is blocked by the mask 402 includes a portion of the metal gate 206/insulator cap 210. This can be seen from a top down view of the mask 402 as shown in FIG. 5. Namely, the cross-sectional view shown in FIG. 4 depicts a cut through line A-A' in FIG. 5. The notion here is that the gate dielectric 208, insulator cap 210, spacers 212, ILD 214, etc. will next be removed from all exposed portions of the MIM capacitor, and replaced with a capacitor dielectric (the insulator) and fill metal (the second electrode). In order access the metal gate 206 (the first electrode), a portion of the metal gate 206 needs to remain uncovered by the capacitor dielectric and fill metal. This portion of the metal gate 206 is what is blocked by the mask 402.

Next, the exposed gate dielectric 208, insulator cap 210, spacers 212, ILD 216 are removed. See FIG. 6. Based on the configuration of the mask 402, these structures are exposed in only (an exposed) portion of each MIM capacitor device (and not in any of the MOSFET devices). This means that, as described above, the covered portions of the gate dielectric 208, insulator cap 210, spacers 212, ILD 216 remain intact. This includes (a covered) portion of each MIM capacitor device (and all of the MOSFET devices).

Figure 6:
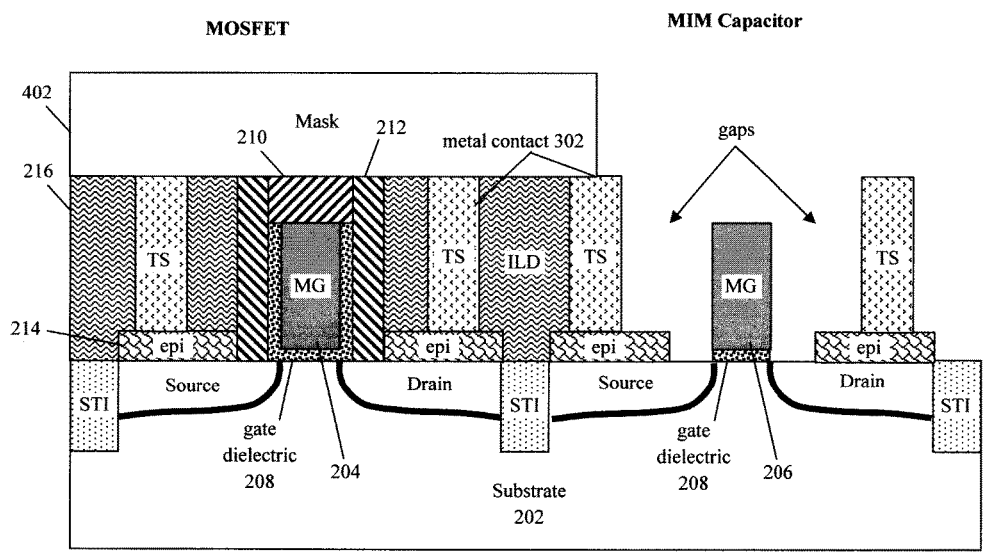
FIG. 6 is a cross-sectional diagram illustrating the exposed gate dielectric, insulator cap, spacers, and ILD having been removed creating gaps between the MIM capacitor (second) metal gate and metal contacts (which together make up a first electrode of the MIM capacitor) according to an embodiment of the present invention.

As shown in FIG. 6, removal of the exposed gate dielectric 208, insulator cap 210, spacers 212, and ILD 216 creates gaps between the metal gate 206 and the (MIM capacitor) metal contacts 302 (which together make up the first electrode—see above). The metal gate 206 and the (MIM capacitor) metal contacts 302 are exposed within the gaps, and it is these gaps that will be filled with the capacitor dielectric (insulator) and fill metal (second electrode) of the MIM capacitor. Since the gate 206 and the contacts 302 are both metal, an etch or series of etches can be used to effectively clear the gate dielectric, insulator cap, spacers, and ILD selective to the metal gate and metal contacts. As shown in FIG. 6, if an anisotropic etching process (such as RIE) is used, a portion of the gate dielectric 208 will remain beneath the metal gate 206. Following this step, the mask 402 can then be removed.

Figure 7:
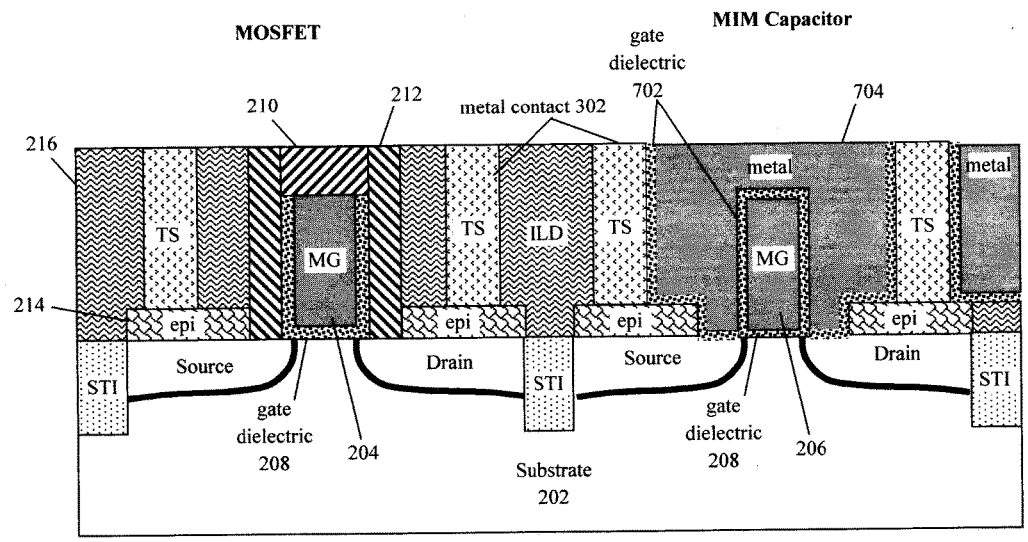
FIG. 7 is a cross-sectional diagram illustrating a capacitor dielectric having been deposited into the gaps, followed by a fill metal according to an embodiment of the present invention.

As shown in FIG. 7, a capacitor dielectric 702 is deposited into the gaps, followed by a fill metal 704. The capacitor dielectric 702 is preferably a high-κ gate dielectric such as $HfO_2$, $ZrO_2$ and/or $La_2O_3$. In fact, capacitor dielectric 702 can (but not necessarily) be the same material as gate dielectric 208. As shown in FIG. 7, the capacitor dielectric 702 is deposited as a conformal layer lining the bottom and sidewalls of the gaps over the metal gate 206 and the (MIM capacitor) metal contacts 302. A conformal deposition process such as chemical vapor deposition (CVD) or atomic layer deposition (ALD) can be employed. According to an exemplary embodiment, the capacitor dielectric 702 has a thickness of from about 1.5 nanometers (nm) to about 10 nm, and ranges therebetween, and more preferably from about 2 nm to about 5 nm, and ranges therebetween.

The fill metal 704 is deposited so as to fill the remaining gaps. Any overfill can be polished back using a process such as chemical mechanical polishing (CMP). Suitable fill metals include, but are not limited to, titanium nitride (TiN), titanium (Ti), tungsten (W), cobalt (Co), and/or aluminum (Al). Polishing the fill metal 704 is important to prevent shorting to the metal contacts 302 by any overfill.

Figure 8:
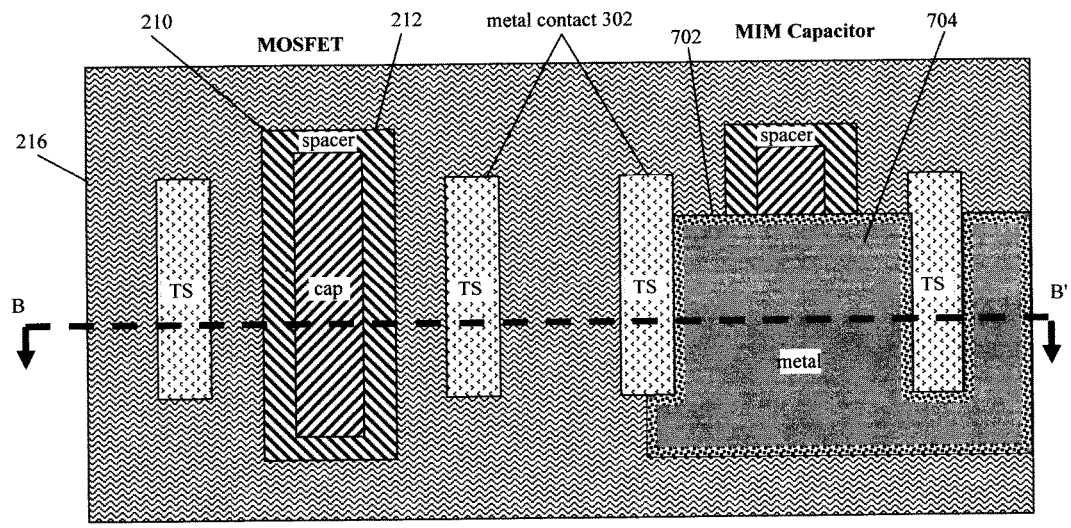
FIG. 8 is a top-down diagram illustrating how the capacitor dielectric and fill metal only partially cover the MIM capacitor (second) metal gate according to an embodiment of the present invention.

As described above, due to the partial masking of the MIM capacitors a portion of each metal gate 206 remains uncovered by the capacitor dielectric 702 and fill metal 704. This can be seen from a top down view of the capacitor dielectric 702 and fill metal 704 as shown in FIG. 8. Namely, the cross-sectional view shown in FIG. 7 depicts a cut through line B-B' in FIG. 8. The uncovered portion provides access (via contacts to be formed as described below) to the metal gate 206 (first electrode) of the MIM capacitor.

To enable metallization, additional ILD 902 is deposited onto the MOSFET and MIM capacitor devices, and contact vias are formed in the ILD 902 to the metal contacts 302 (i.e., contact vias 904), to the metal gates 204 and 206 (i.e., contact vias 906), and to the fill metal 704/MIM capacitor second electrode (i.e., contact vias 908). See FIG. 9. According to an exemplary embodiment, the contact vias 904-908 are formed by first patterning vias in the ILD 902 down to the respective metal contact, gate and/or electrode, and then filling the via with a suitable contact metal, such as tungsten (W), cobalt (Co), copper (Cu), nickel (Ni) and/or platinum (Pt). The use of multiple contact vias 908 to the fill metal 704 serves to reduce the resistance of the contact.

Figure 9:
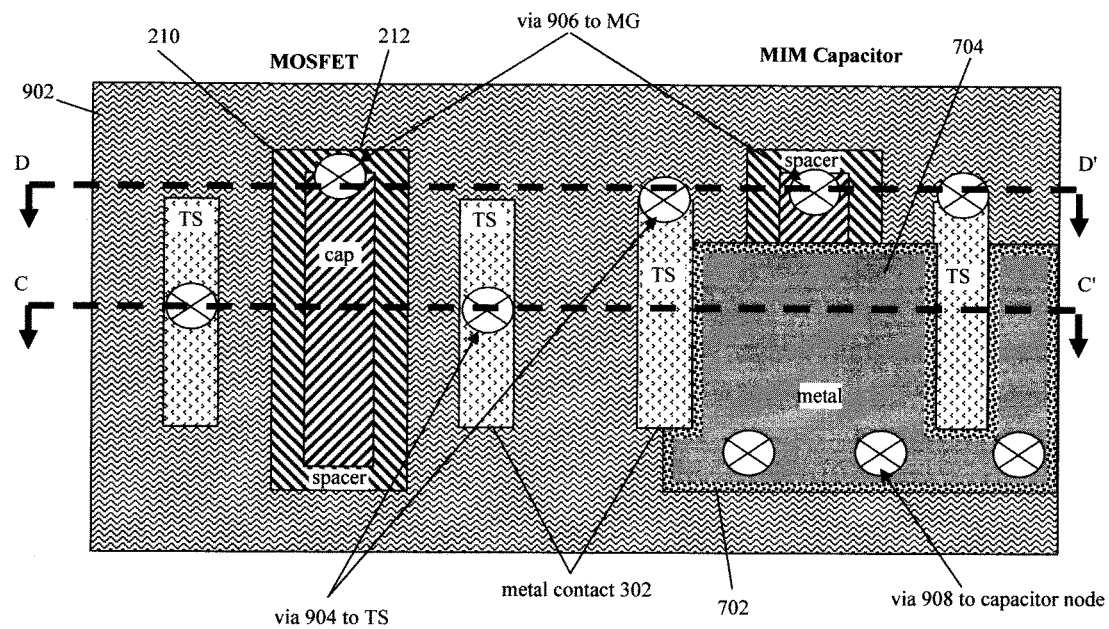
FIG. 9 is a top-down diagram illustrating additional ILD having been deposited onto the MOSFET and MIM capacitor devices, and contact vias having been formed in the ILD to the metal contacts, the metal gates, and the fill metal according to an embodiment of the present invention.
Figure 10:
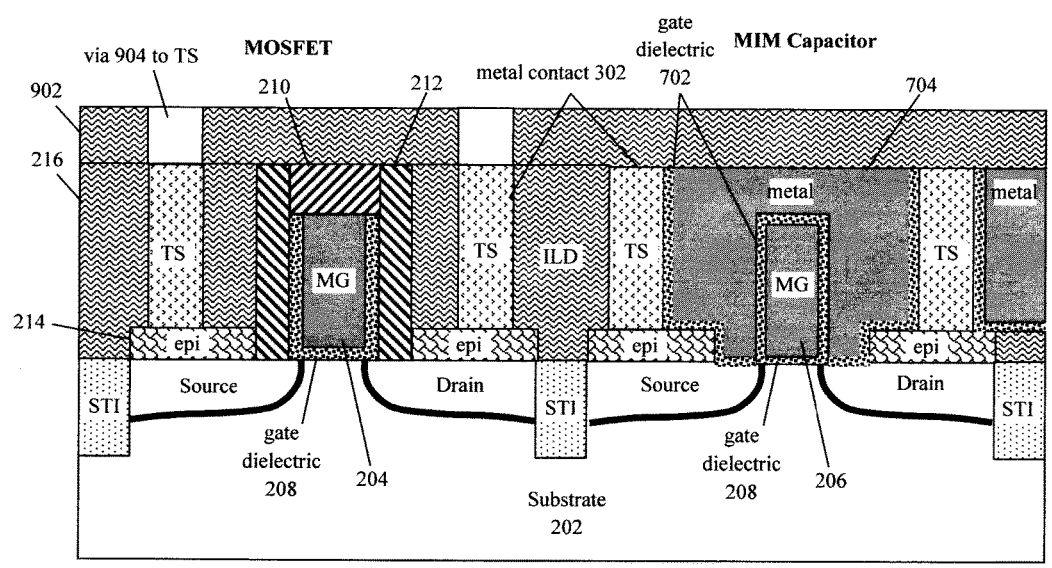
FIG. 10 is a cross-sectional diagram illustrating the contact vias formed in the ILD to the metal contacts according to an embodiment of the present invention.
Figure 11:
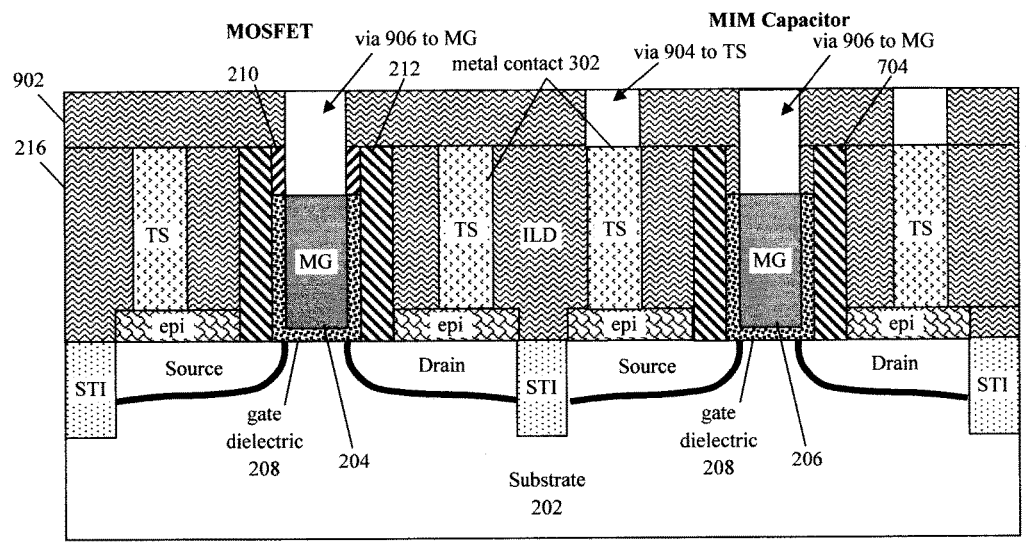
FIG. 11 is a cross-sectional diagram illustrating the contact vias formed in the ILD to the metal gates according to an embodiment of the present invention.

FIG. 10 depicts a cut through line C-C' in FIG. 9 which illustrates the contact vias formed in the ILD 902 to the metal contacts 302 (i.e., contact vias 904). FIG. 11 depicts a cut through line D-D' in FIG. 9 which illustrates the contact vias formed in the ILD 902 to the metal gates 204 and 206 (i.e., contact vias 906).

Figure 12:
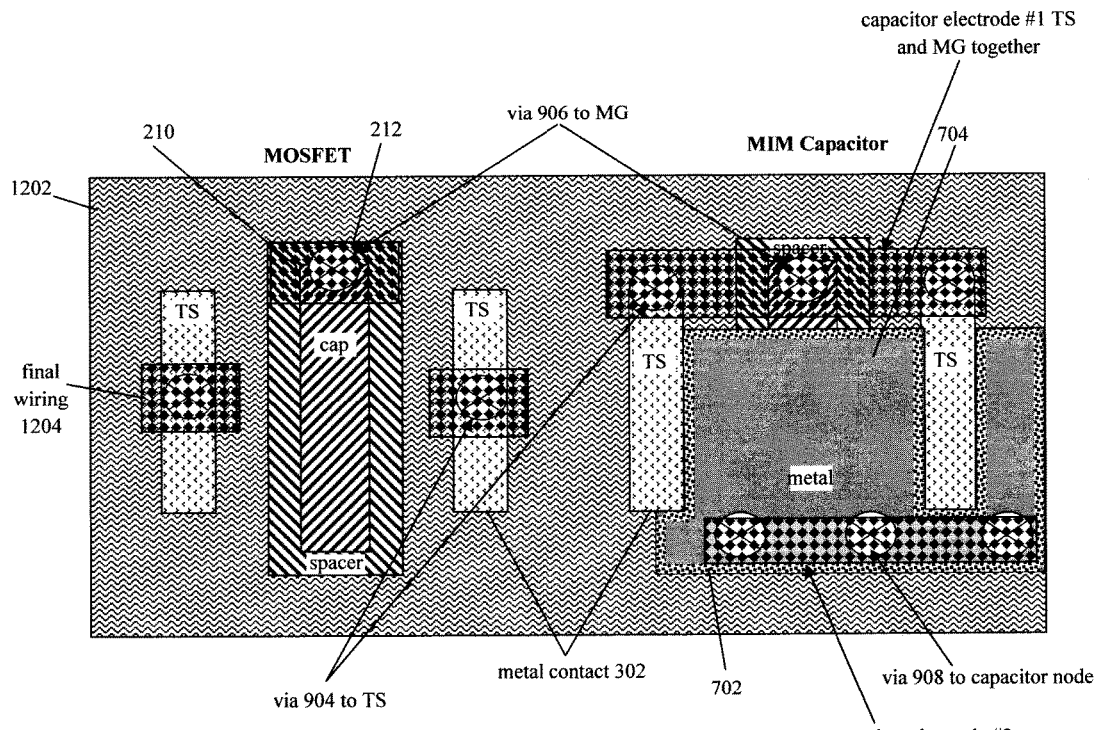
FIG. 12 is a top-down diagram illustrating final device wiring having been formed according to an embodiment of the present invention.

Final device wiring is then formed. See FIG. 12. In the same manner as described above, this involves depositing additional ILD 1202 over the MOSFET and MIM capacitor devices, and then using standard metallization techniques to form the wiring 1204 in the ILD 1202 connected to the contact vias. As shown in FIG. 12, wiring 1204 includes a first capacitor electrode ("Capacitor electrode #1") and a second capacitor electrode ("Capacitor electrode #1"). Capacitor electrode #1 shorts the (MIM capacitor) metal contacts 302 and the metal gate 206 together. The capacitor electrode #2 ties together the contact vias to the metal fill 704.

Figure 13:
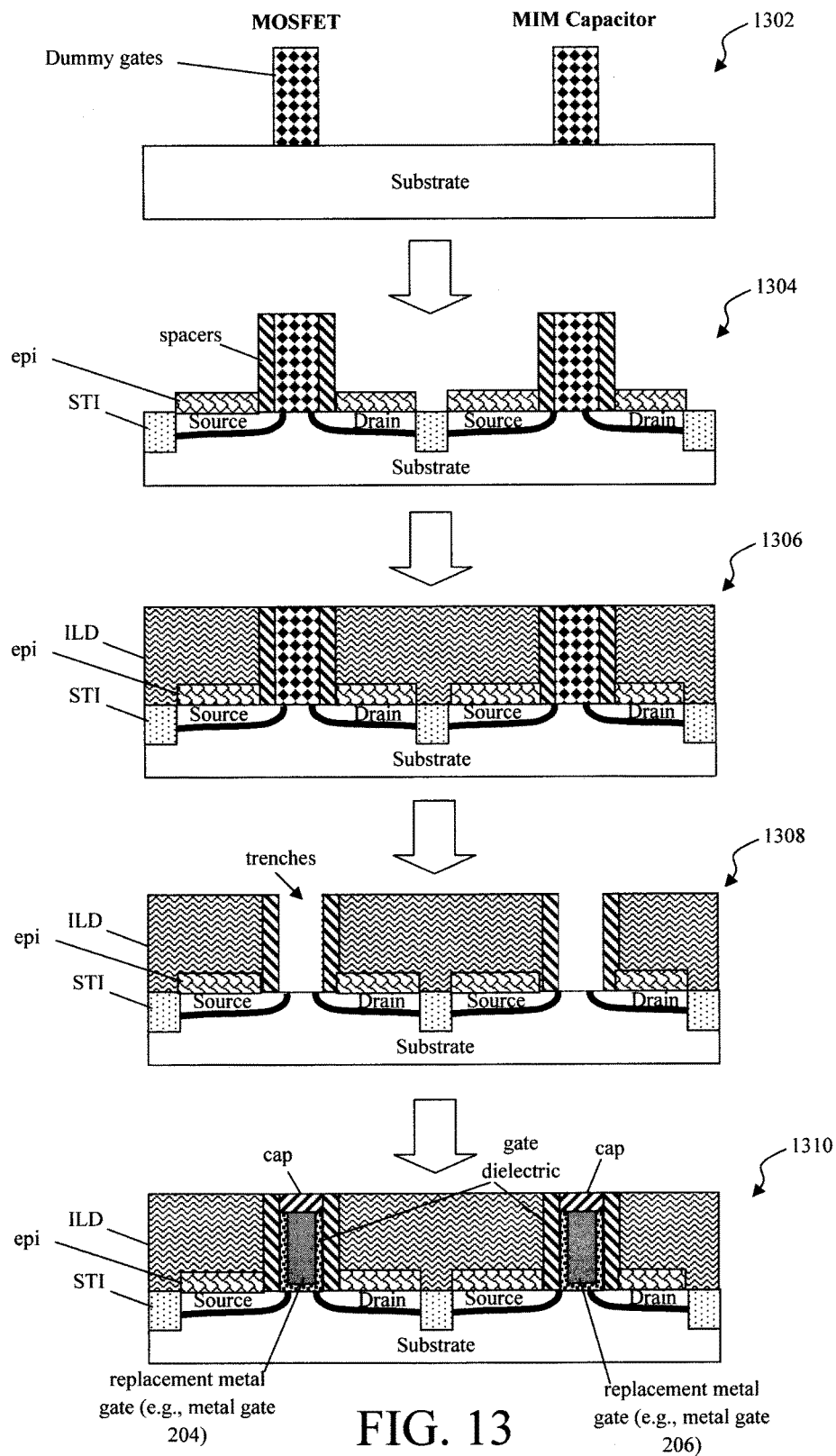
FIG. 13 is a diagram illustrating an exemplary replacement metal gate process according to an embodiment of the present invention.

FIG. 13 is a diagram illustrating an exemplary replacement metal gate process that may be implemented in accordance with the present techniques (see description of FIG. 1, above). As described above, dummy gates are placed early in the process to serve as placeholders for the final replacement metal gate. Thus, as shown in step 1302, at least one dummy gate is placed on the substrate. In accordance with the exemplary process flow described in conjunction with the description of FIG. 1 above, at least one first dummy gate (corresponding to the metal gate(s) 204 of the MOSFET) and at least one second dummy gate(s) 206 (corresponding to the metal gate(s) 206 of the MIM capacitor) are formed in the first active region (labeled "MOSFET") and in the second active area (labeled "MIM capacitor"), respectively.

Suitable dummy gate materials include, but are not limited to amorphous silicon (aSi) or poly-silicon (poly-Si). For instance, poly-Si can be deposited onto the substrate, and standard lithography and etching techniques can be used to pattern the poly-Si into the individual dummy gates. Other suitable patterning technique such as sidewall image transfer (SIT) can be used to form the dummy gates.

The dummy gate permits placement of the spacers and source and drain, without exposing the replacement metal gate to potentially harmful processing conditions. Namely, as shown in step 1304, spacers are formed on opposite sides of each of the dummy gates, and source and drain regions are also formed on opposite sides of the dummy gates, offset by the spacers. Namely, each of the MOSFET devices being formed will include a source region and a drain region, a channel between the source and drain regions, and a replacement metal gate stack which regulates current flow through the channel. By way of example only, the spacers can be formed by blanket depositing a suitable spacer material (such as silicon nitride (SiN), silicon-boron-carbon-nitrogen (SiBCN), silicon-oxygen-carbon-nitrogen (SiOCN), or silicon-oxygen-carbon (SiOC)) onto the wafer and then using an anisotropic etching process, such as reactive ion etching (ME), to define the spacers in the material on opposite sides of the dummy gates.

Any suitable standard doping techniques may be employed to form doped source and drain regions. Exemplary doping techniques include ion implantation, gas phase doping, plasma doping, plasma immersion ion implantation, cluster doping, infusion doping, liquid phase doping, solid phase doping, etc. According to an exemplary embodiment, the source and drain regions are formed by epitaxy with in-situ or ex-situ doping.

By way of example only, suitable n-type dopants include but are not limited to phosphorous (P), arsenic (As), and antimony (Sb), and suitable p-type dopants include but are not limited to boron (B), gallium (Ga), and indium (In). The source and drain region dopants may be incorporated into the substrate on opposite sides of the dummy gates and diffused to the edges of the dummy gate using thermal anneals.

Source and drains are formed after the source/drain doping. According to an exemplary embodiment, the source and drains are formed using a standard epitaxial growth process (see "epi" labeled in FIG. 13). The epitaxy source/drain can be doped by in-situ or ex-situ doping techniques.

In step 1306, the dummy gates are buried in an inter-layer dielectric (labeled "ILD"). The ILD is then polished back to expose the tops of the dummy gates. Exposing the tops of the dummy gates permits the dummy gates to be removed selective to the ILD. Namely, in step 1308, the dummy gates are removed selective to the ILD and spacers. When the dummy gates are formed from poly-Si, a poly-Si selective RIE may be employed in step 1308. As a result of the dummy gate removal, trenches (i.e., gate trenches) are left in the ILD.

In step 1310, replacement metal gates are formed in the gate trenches. In accordance with the exemplary process flow described in conjunction with the description of FIG. 1 above, at least one of the replacement metal gates is the metal gate(s) 204 of the MOSFET, and at least another one of the replacement metal gates is the metal gate(s) 206 of the MIM capacitor.

Each metal gate 204 and 206 includes a metal or combination of metals. For instance, according to an exemplary embodiment, the metal gates include a workfunction setting metal (on a gate dielectric) and a filler metal on the workfunction setting metal. The particular workfunction setting metal varies depending on whether an n-type or p-type transistor is desired. Suitable n-type workfunction setting metals include, but are not limited to, titanium nitride (TiN), tantalum nitride (TaN), and aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and tantalum aluminum carbide (TaAlC). Suitable p-type workfunction setting metals include, but are not limited to, TiN, TaN, and tungsten (W). The filler metal is preferably a low resistance metal such as tungsten (W) and/or aluminum (Al).

The metal gates are each separated from the substrate by a gate dielectric. According to an exemplary embodiment, the gate dielectric is a high-κ gate dielectric, such as $HfO_2$, $ZrO_2$ and/or $La_2O_3$. In the context of a replacement metal gate process, the gate dielectric is being deposited into the trenches (left behind following the dummy gate removal). Thus the gate dielectric, if deposited as a conformal layer, can line the bottom and sidewalls of the gate trenches. See FIG. 13. For simplicity, it is preferable to employ the same gate dielectric and gate metal(s) for all of the metal gates (i.e., the same gate configuration for both the MOSFET and MIM capacitor) so as to enable co-fabrication of the starting structure of both devices (as described above in conjunction with the description of FIG. 1 above, the starting structures for the MOSFET and MIM capacitor can be the same). However, the metal gates for MOSFET and MIM capacitor can be configured differently and thus processed individually if so desired.

An insulator cap can be used to protect the (now-formed) replacement metal gates during subsequent processing steps. By way of example only, the insulator cap can include a nitride (e.g., SiN) and/or oxide ($SiO_2$) cap. See FIG. 13.

Although illustrative embodiments of the present invention have been described herein, it is to be understood that the invention is not limited to those precise embodiments, and that various other changes and modifications may be made by one skilled in the art without departing from the scope of the invention.

What is claimed is:
1. A method for forming a device, comprising:
forming at least one metal-oxide-semiconductor field effect transistor (MOSFET) structure on a first active area of a substrate and at least one metal-insulator-metal (MIM) capacitor structure on a second active area of the substrate, wherein the MOSFET and MIM structures each comprise: a metal gate, and source and drain regions on opposite sides of the metal gate, and wherein the MOSFET and MIM structures are buried in a dielectric;

forming metal contacts in the dielectric over, and extending down to, the source and drain regions;

forming a mask that selectively covers the MOSFET structure leaving at least a portion of the MIM capacitor structure uncovered;

removing the dielectric from the uncovered portion of the MIM capacitor structure forming gaps between the metal contacts and the metal gate in the MIM capacitor structure;

depositing a capacitor dielectric in the gaps over the metal contacts and the metal gate in the MIM capacitor structure; and depositing a fill metal onto the capacitor dielectric filling the gaps, wherein the metal contacts and the metal gate in the MIM capacitor structure comprise a first electrode, and the fill metal comprises a second electrode of the MIM capacitor structure, and wherein the capacitor dielectric separates the first electrode from the second electrode.

2. The method of claim 1, further comprising:
isolating the first active area and the second active area of the substrate using shallow trench isolation (STI).

3. The method of claim 1, wherein the MOSFET structure and the MIM structure each further comprises: spacers on opposite sides of the metal gate offsetting the source and drain regions.

4. The method of claim 1, wherein the MOSFET structure and the MIM structure each further comprises:
an insulator cap on the metal gate.

5. The method of claim 1, further comprising:
forming at least one first dummy gate on the first active area of the substrate and at least one second dummy gate on the second active area of the substrate;
forming spacers on opposite sides of the first dummy gate and on opposite sides of the second dummy gate;
forming source and drain regions in the substrate on opposite sides of the first dummy gate and on opposite sides of the second dummy gate, offset by the spacers;
depositing the dielectric onto the substrate burying the first dummy gate and the second dummy gate;
removing the first dummy gate and the second dummy gate forming gate trenches in the dielectric; and
forming metal gates in the gate trenches.

6. The method of claim 5, wherein the first dummy gate and the second dummy gate each comprise a material selected from the group consisting of: poly-silicon and amorphous silicon.

7. The method of claim 1, further comprising:
patterning contact trenches in the dielectric over, and extending down to, the source and drain regions; and
forming the metal contacts in the contact trenches.

8. The method of claim 7, wherein the metal contacts are formed in the contact trenches using a trench silicide process which comprises:
depositing a liner into the contact trenches;
depositing a metal onto the liner, filling the contact trenches; and
annealing the substrate at a temperature of greater than about 400° C. to react the liner with the source and drain regions to form a silicide interface between the metal and the source and drain regions.

9. The method of claim 8, wherein the liner comprises a material selected from the group consisting of: titanium, nickel-platinum, and combinations thereof, and wherein the metal comprises tungsten.

10. The method of claim 1, wherein the mask: i) fully covers the MOSFET structure, and ii) partially covers the MIM capacitor structure.

11. The method of claim 10, wherein the mask covers a portion of the metal gate in the MIM capacitor structure.

12. The method of claim 1, wherein the capacitor dielectric comprises a high-κ dielectric.

13. The method of claim 12, wherein the high-κ gate dielectric is selected from the group consisting of hafnium oxide, zirconium oxide, lanthanum oxide, and combinations thereof.

14. The method of claim 1, wherein the fill metal is selected from the group consisting of: titanium nitride, titanium, tungsten, cobalt, aluminum, and combinations thereof.

15. The method of claim 1, further comprising:
forming contact vias to the metal contacts and the metal gate in the MIM capacitor, and to the fill metal.

16. The method of claim 15, further comprising:
connecting i) the contact vias to the metal contacts in the MIM capacitor with ii) the contact vias to the metal gate in the MIM capacitor.

17. A MIM capacitor, comprising:
a metal gate;
source and drain regions on opposite sides of the metal gate;
metal contacts on the source and drain regions;
a capacitor dielectric over the metal contacts and the metal gate; and
a fill metal on the capacitor dielectric filling gaps between the metal gate and the metal contacts, wherein the metal contacts and the metal gate comprise a first electrode, and the fill metal comprises a second electrode of the MIM capacitor, and wherein the capacitor dielectric separates the first electrode from the second electrode.

18. The MIM capacitor of claim 17, wherein the metal contacts comprise a trench silicide.

19. The MIM capacitor of claim 17, wherein the capacitor dielectric comprises a high-κ dielectric.

20. The MIM capacitor of claim 17, wherein the fill metal is selected from the group consisting of: titanium nitride, titanium, tungsten, cobalt, aluminum, and combinations thereof.

21. A device, comprising:
a MOSFET on a first active area of a substrate, the MOSFET comprising: a first metal gate, and first source and drain regions on opposite sides of the first metal gate; and
a MIM capacitor on a second active area of the substrate, the MIM capacitor comprising: a second metal gate, second source and drain regions on opposite sides of the second metal gate, metal contacts on the second source and drain regions; a capacitor dielectric over the metal contacts and the second metal gate, and a fill metal on the capacitor dielectric filling gaps between the second metal gate and the metal contacts, wherein the metal contacts and the second metal gate comprise a first electrode, and the fill metal comprises a second electrode of the MIM capacitor, and wherein the capacitor dielectric separates the first electrode from the second electrode.

* * * * *